(12) United States Patent
Hekmatshoartabari et al.

(10) Patent No.: US 11,942,388 B2
(45) Date of Patent: Mar. 26, 2024

(54) TEMPERATURE-ASSISTED DEVICE WITH INTEGRATED THIN-FILM HEATER

(71) Applicant: INTERNATIONAL BUSINESS MACHINES CORPORATION, Armonk, NY (US)

(72) Inventors: Bahman Hekmatshoartabari, White Plains, NY (US); Takashi Ando, Eastchester, NY (US); Nanbo Gong, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 504 days.

(21) Appl. No.: 17/301,939

(22) Filed: Apr. 20, 2021

(65) Prior Publication Data

US 2022/0336312 A1    Oct. 20, 2022

(51) Int. Cl.
*H01L 23/34* (2006.01)
*G01K 7/02* (2021.01)
*H01L 23/522* (2006.01)

(52) U.S. Cl.
CPC ............ *H01L 23/345* (2013.01); *G01K 7/021* (2013.01); *H01L 23/5226* (2013.01)

(58) Field of Classification Search
CPC ............... H01L 23/345; H01L 23/5226; H01L 23/5228; G01K 7/021; G01K 3/005; G01K 7/425; G01K 7/028

See application file for complete search history.

(56) References Cited

U.S. PATENT DOCUMENTS

| | | | |
|---|---|---|---|
| 9,305,650 B2 | 4/2016 | Gopalakrishnan | |
| 10,460,804 B2 | 10/2019 | Bauer | |
| 10,467,134 B2 | 11/2019 | Kankani | |
| 2012/0280224 A1 | 11/2012 | Doolittle | |
| 2014/0254286 A1 | 9/2014 | Bronner | |
| 2016/0071608 A1* | 3/2016 | Bronner | G11C 13/0002 365/185.18 |
| 2019/0141789 A1* | 5/2019 | Wang | H05B 1/0227 |
| 2019/0198762 A1 | 6/2019 | Afzali-Ardakani | |

FOREIGN PATENT DOCUMENTS

| | | |
|---|---|---|
| WO | 2010087833 A1 | 8/2010 |
| WO | 2016032502 A1 | 3/2016 |

OTHER PUBLICATIONS

Demler, "Mythic Multiplies in a Flash", Analog In-Memory Computing Eliminates DRAM Read/Write Cycles, Microprocessor report, The Linley Group, Aug. 27, 2018, pp. 1-3.

(Continued)

*Primary Examiner* — J. E. Schoenholtz
(74) *Attorney, Agent, or Firm* — L. Jeffrey Kelly

(57) ABSTRACT

An embodiment of the invention may include a semiconductor structure, method of use and method of manufacture. The structure may include a heating element located underneath a temperature-controlled portion of the device. A method of operating the semiconductor device may include providing current to a thin film heater located beneath a temperature-controlled region of the semiconductor device. The method may include performing temperature dependent operations in the temperature-controlled region.

16 Claims, 9 Drawing Sheets

(56) References Cited

OTHER PUBLICATIONS

Fick, "Analog Computation in Flash Memory for Datacenter-scale AI Inference in a Small Chip", Mythic @ Hot Chips 2018, 22 pages, Accessed on Apr. 9, 2021.

Moore, "Two Startups Use Processing in Flash Memory for AI at the Edge", Mythic AI and Syntiant sound similar on the surface, but they're after different markets, Accessed on Apr. 12, 2021, 3 pages.

Pending U.S. Appl. No. 16/785,797, filed Feb. 10, 2020, entitled: "Temperature Assisted Programming of Flash Memory for Neuromorphic Computing", 34 pages.

Upadhyay, et al., "Emerging Memory Devices for Neuromorphic Computing", Advanced Materials Technologies, 2019, pp. 1800589 to 1800589, ttps://onlinelibrary.wiley.com/doi/pdf/10.1002/admt.201800589.

* cited by examiner

TEMPERATURE-ASSISTED DEVICE WITH INTEGRATED THIN-FILM HEATER

BACKGROUND

The present invention relates to semiconductor structures, and more specifically, to enabling semiconductor chips with temperature-assisted programmable devices.

Deep learning is a machine learning method based on artificial neural networks inspired by (and loosely emulating) the information processing in biological systems. Neuromorphic computing is aimed at emulating the neural structure and operation of the brain more closely. Programmable semiconductor devices (including non-volatile memory devices) are used to implement the neural connections (synaptic weights) in deep learning and neuromorphic computing chips. Altering the programmable states of the semiconductor devices may be facilitated at elevated temperatures.

Wafer bonding is a packaging technology on wafer-level for the fabrication of microelectromechanical systems (MEMS), nanoelectromechanical systems (NEMS), microelectronics and optoelectronics, ensuring a mechanically stable and hermetically sealed encapsulation. The wafers' diameter up to 300 mm (12 inches) for the production of microelectronic devices.

BRIEF SUMMARY

An embodiment of the invention may include a semiconductor structure. The structure may include a heating element located underneath a temperature controlled portion of the device.

An embodiment of the invention may include a method of operating the semiconductor device. The method may include providing current to a thin film heater located beneath a temperature-controlled region of the semiconductor device. The method may include performing temperature dependent operations in the temperature-controlled region.

An embodiment of the invention may include a method to form a semiconductor structure. The method may include forming a logic device, a temperature-controlled device on a first handling wafer. The method may include attaching a second handling wafer opposite to the first handling wafer. The method may include removing a portion of the first handling wafer. The method may include forming a heating element on a remaining portion of the first handling wafer, wherein the heating element is beneath the temperature-controlled device.

Figure 1:
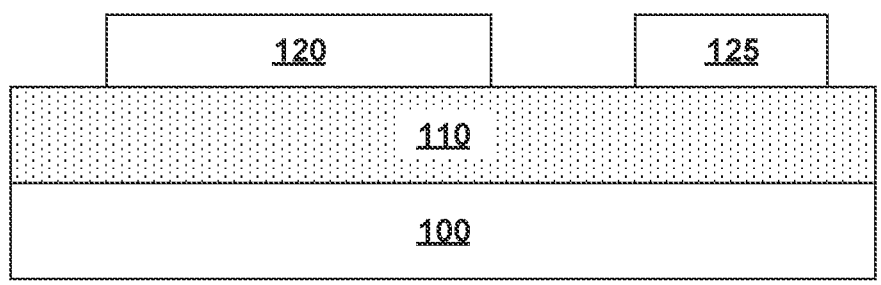
FIG. 1 is a cross-section view depicting a peripheral circuit region and a temperature-controlled region located on a carrier substrate, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embedded flash memory is a mature technology available from foundries and has been used for the implementation of neuromorphic computing chips. However, their application is limited to inference for edge devices due to the high voltages used to program and erase the flash memory. A low-voltage flash memory, such as the flash memory detailed in U.S. patent application Ser. No. 16/785,797, which is herein incorporated by reference, with a thin tunnel dielectric can be effectively trained at high temperatures (e.g. >125° C.) and used for inference at lower temperatures (e.g. <50° C.).

However, utilization of these devices in neuromorphic chips requires an integrated heater solution. In this application we describe structures and methods that enable temperature assisted programming of low-voltage flash memory cells in neuromorphic computing chips with integrated thin film heaters. In one embodiment, an array of low-voltage flash cells is co-integrated with peripheral CMOS circuits in an SOI chip and a thin-film heater is disposed on the opposite side of the buried oxide (BOX) encompassing the flash cell array area, and contact vias are formed through the BOX to establish electrical connection between the thin-film heater and the CMOS circuits.

Referring to FIG. 1, a peripheral circuit region 120 and a temperature-controlled region 125 may be formed on a buried insulator 110 of a carrier substrate 100.

According to an example embodiment, the carrier substrate 100 is a bulk semiconductor wafer, such as a bulk silicon (Si), bulk germanium (Ge), and/or bulk III-V semiconductor wafer. Together with a SOI layer (not shown), the buried insulator 110 and the carrier substrate 100 form a semiconductor-on-insulator (SOI) wafer. When the buried insulator 110 is an oxide it is referred to herein as a buried oxide layer 110 or BOX layer 110. The SOI layer can include any suitable semiconductor, such as Si, Ge, SiGe, and/or a III-V semiconductor. The SOI layer is used as the substrate material for the fabrication of circuit elements such as transistors, diodes, capacitors, resistors, interconnects, wiring, etc. in the peripheral circuit region 120 and the temperature-controlled region 125, as well as temperature-assisted programmable devices (i.e. flash memory) in the temperature-controlled region 125.

The temperature-controlled region 125 may include structures that have a temperature dependent operation above ambient. In one embodiment, the temperature-controlled region 125 may include temperature assisted flash memory, such as the flash memory detailed in U.S. patent application Ser. No. 16/785,797.

Figure 2:
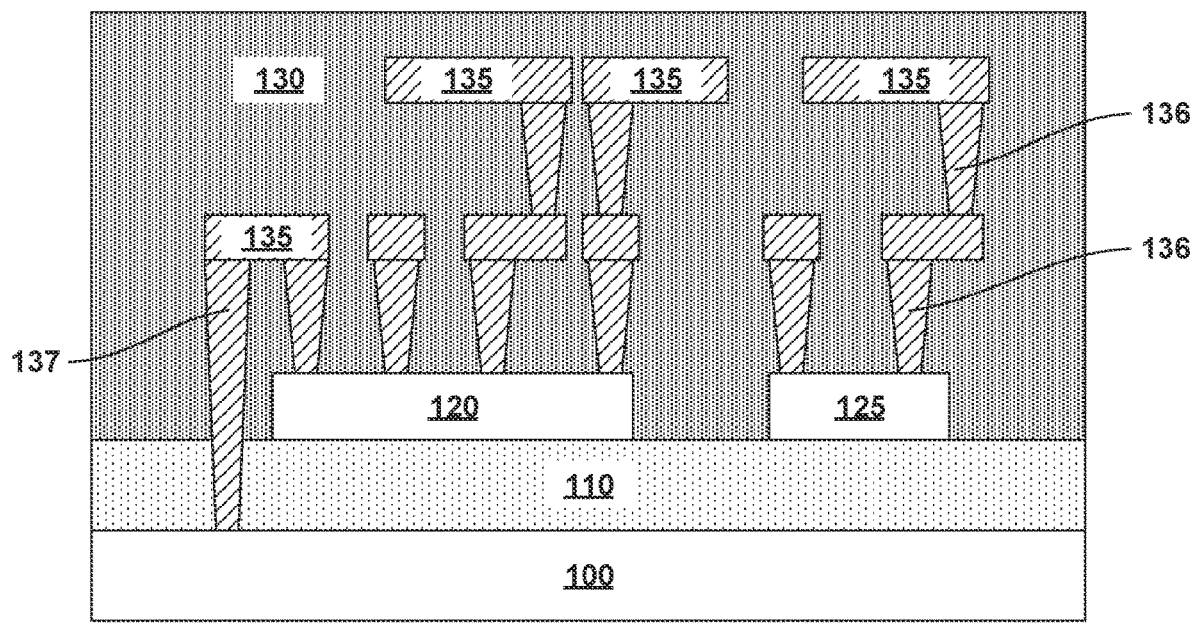
FIG. 2 is a cross-section view depicting forming wiring and dielectric above the peripheral circuit region and the temperature-controlled region, according to an example embodiment.

Referring to FIG. 2, wiring, including metal lines 135, vias 136, and a through via 137, and a dielectric 130 may be formed above the peripheral circuit region 120 and the temperature-controlled region 125. The dielectric 130 may be deposited over the structure, and subsequent damascene or dual damascene structures may be created. The dielectric 130 may be deposited using typical deposition techniques, for example, chemical vapor deposition. The dielectric 130 may include any suitable dielectric material, for example, SiO2, Si3N4, SiOxNy, SiC, SiCO, SiCOH, and SiCH compounds, the above-mentioned silicon containing materials with some or all of the Si replaced by carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H).

Still referring to FIG. 2, various etching techniques may be used to form trenches and vias that may be subsequently filled with metal to form the metal lines 135, the vias 136, and the through via 137. The trenches and vias may be formed using any suitable masking and etching technique known in the art. In one embodiment, a dry etching technique using a fluorine based etchant, such as, for example $C_xF_y$, may be used. Also, the vias 136 may extend vertically from the bottom of the trench openings, later to be filled and formed as the metal lines 135, down to the top of devices in the peripheral circuit region 120, the temperature-controlled region 125, or to the metal lines 135, which may be used to form the vias 136; or to the carrier substrate 100 to form the through via 137.

The etched lines and vias may be filled with metallic interconnects, forming the metal lines 135, the vias 136, and the through via 137. The metallic interconnects may contain a liner and a metal fill may be deposited in via recess. The liner may be made of, for example, tantalum or tantalum nitride, or titanium and titanium nitride, as adhesion layer for subsequent tungsten deposition, and may include one or more layers of liner material. The metal fill may include, for example, copper, aluminum, or tungsten. The liner (the metal liner can also be done by ALD, more preferred for a liner) and metal fill may be formed using a technique such as electroplating, electroless plating, chemical vapor deposition, physical vapor deposition or a combination of methods.

The above process of depositing dielectric, creating trenches and vias, and filling the trenches and vias to form metallic interconnects may be performed multiple times to create complex interconnect structures. Additionally, in some embodiments, additional electrical circuit structures may be included in higher levels such as memory, capacitors, resistors, etc.

Figure 3:
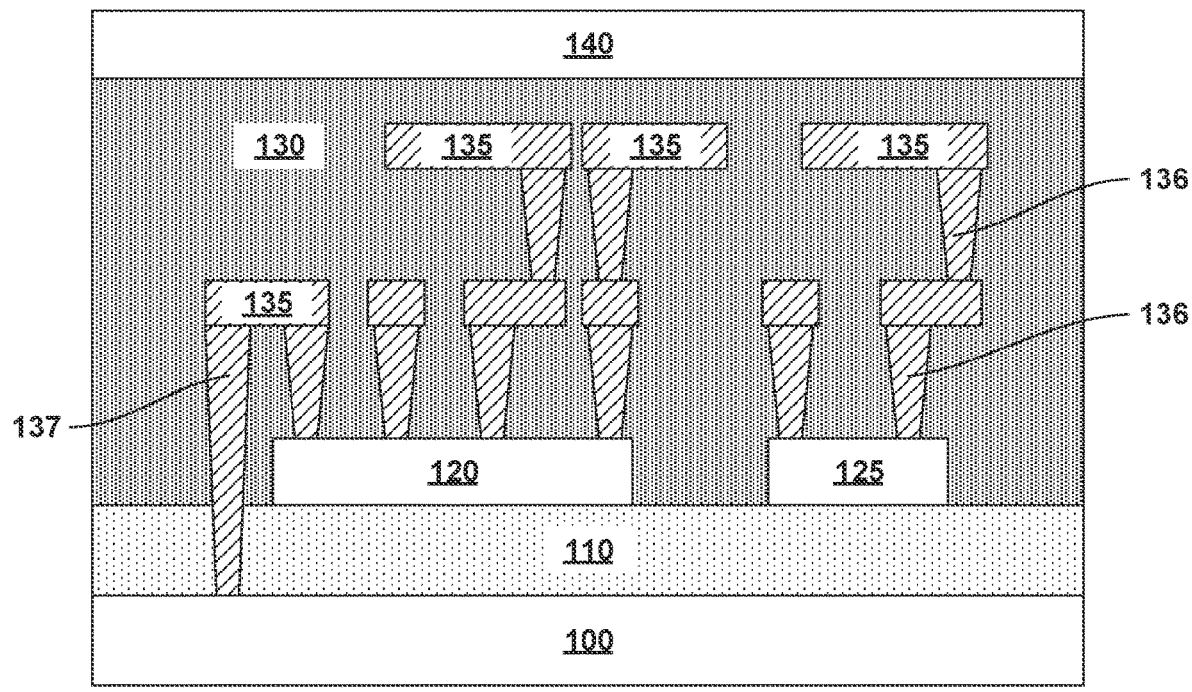
FIG. 3 is a cross-section view depicting joining a handling substrate to a peripheral circuit region and temperature-controlled region, according to an example embodiment.
Figure 4:
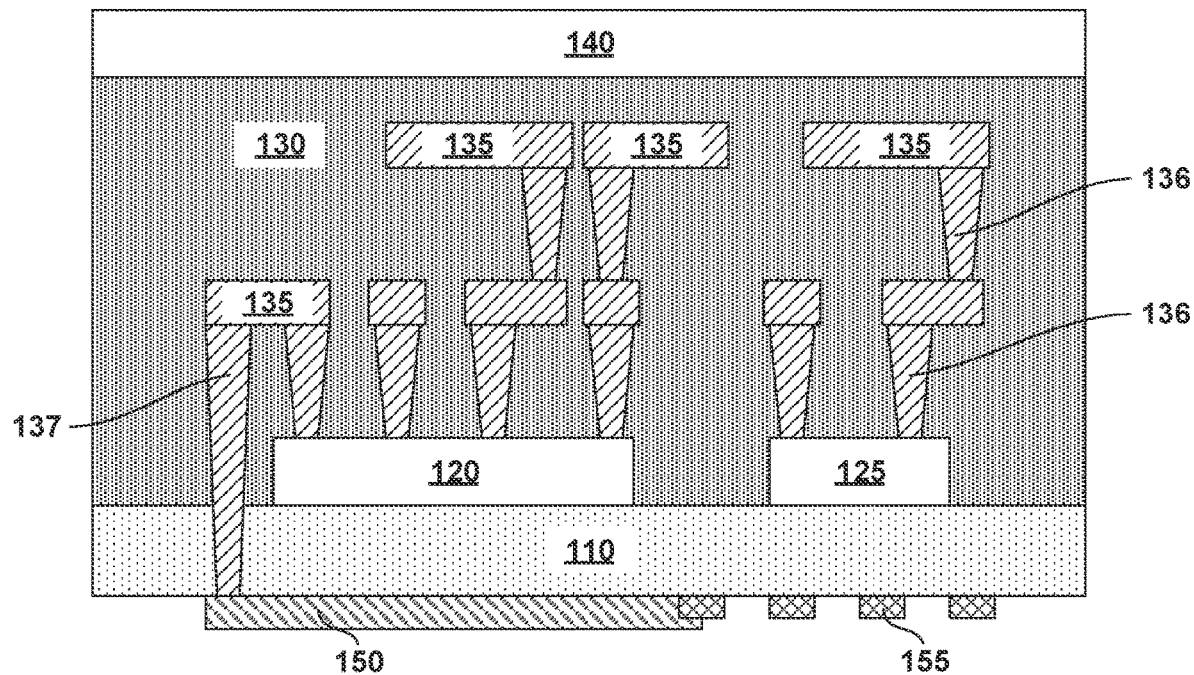
FIG. 4 is a cross-section view depicting removing the carrier substrate, according to an example embodiment.

Referring to FIG. 3, a handling substrate 140 may be joined to the dielectric 130. The handling substrate 140 may be bonded to an upper surface of the dielectric 130. FIG. 4 illustrates the semiconductor structure following the bonding of the handling substrate 140 to the dielectric 130. The dielectric 130 may be bonded to the handling substrate 140 to provide structural support during subsequent processing.

Referring to FIG. 4, the carrier substrate 100 may be removed. The carrier substrate 100 may be removed through any processing technique capable of reducing the thickness of the carrier substrate 100 such as, for example, grinding.

Figure 5:
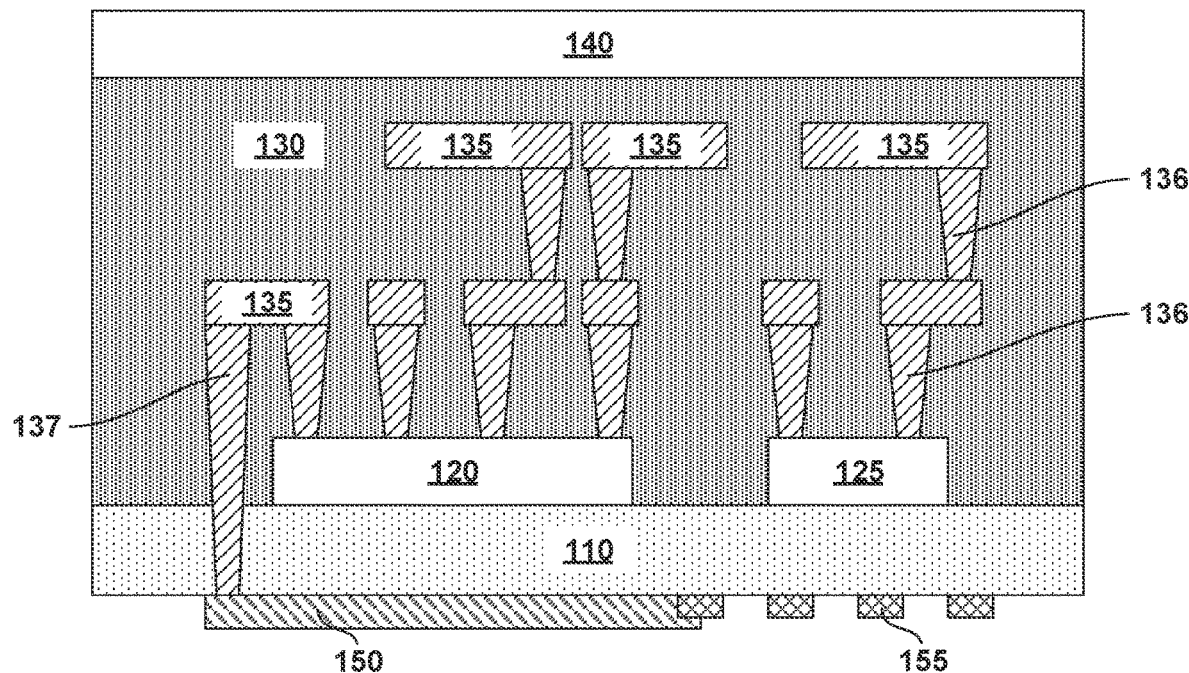
FIG. 5 is a cross-sectional view depicting depositing a thin film heater, and associated wiring, beneath the temperature-controlled region, according to an example embodiment.

Referring to FIG. 5, a heating element 155 (hereinafter "a thin film heater 155") and backside wiring 150 may be formed on the opposite side of the BOX layer 110 as the handling substrate 140. In other words, the BOX layer 110 separates the temperature-controlled region 125 from the thin film heater 155. In such cases, the thickness of the BOX layer 110 may range from about 100 nm to about 500 nm, but thicker or thinner layers may be used as well. It should be noted that the thickness of the BOX layer 110 directly affects heating of the temperature-controlled region 125 by the thin film heater 155. The thin film heater 155 may be made of any suitable resistive heating material such as, for example, refractory metals such as tungsten, molybdenum and tantalum. The deposition of the thin film heater 155 may be performed using any suitable method in the art such as, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). Following the deposition, the thickness of the thin film heater 155 may range from about 10 nm to about 20 nm, but thinner or thicker layers may be used as well. The thin film heater 155 may be patterned using lithographic techniques following by removal of unwanted material through etching. The thin film heater 155 configuration is not limited to a particular form or geometry. Various configurations (e.g. coils, spirals, lines, etc.) may be used, and determined for use by one having ordinary skill in the art.

The backside wiring 150 may be made of any suitable metallic interconnects, and may be formed using various known deposition and patterning techniques including the methods described above with respect to the metal lines 135. The deposition of the backside wiring 150 may be performed using any suitable method in the art such as, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). Following the deposition, the thickness of the backside wiring 150 may range from about 50 nm to about 100 nm, but thinner or thicker layers may be used as well. The backside wiring 150 may be patterned using lithographic techniques following by removal of unwanted material through etching. Typically, the patterned segments of the thin film heater 155 are thinner and/or narrower than that of the backside wiring 150 to facilitate a higher electrical resistance for the thin film heater 155 than the backside wiring 150.

In the present embodiment, at least one of the through vias 137 extends through the insulating layer 110 and forms an electrical connection between the circuit region and the heating element.

Figure 6:
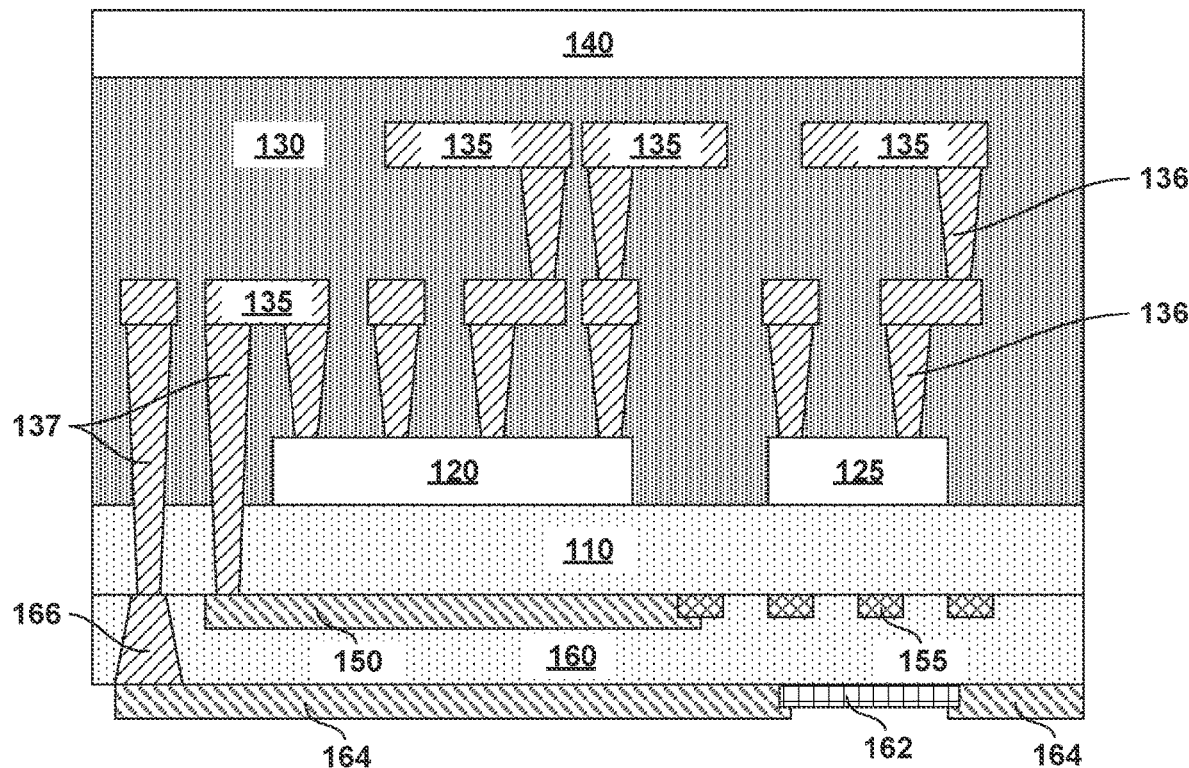
FIG. 6 is a cross-sectional view depicting depositing an optional dielectric and thermocouple, according to an example embodiment.

Referring to FIG. 6, an optional step of forming a dielectric 160, a thermocouple 162, thermocouple wiring 164, and a through via 166 is shown opposite of the handling substrate 140. In such cases, the dielectric 160 separates the thin film heater 155 from the thermocouple 162. The dielectric 160 may be deposited using typical deposition techniques, for example, chemical vapor deposition. The dielectric 160 may include any suitable dielectric material, for example, SiO2, Si3N4, SiOxNy, SiC, SiCO, SiCOH, and SiCH compounds, the above-mentioned silicon containing materials with some or all of the Si replaced by carbon doped oxides, inorganic oxides, inorganic polymers, hybrid polymers, organic polymers such as polyamides or SiLK™ other carbon containing materials, organo-inorganic materials such as spin-on glasses and silsesquioxane-based materials, and diamond-like carbon (DLC), also known as amorphous hydrogenated carbon, α-C:H). The thickness of the dielectric 160 may range from about 100 nm to about 500 nm, but thicker or thinner layers may be used as well.

The thermocouple 162 may be a thin-film thermocouple structure known in the art such as, for example, Ni/Cr, poly-Ge/Al, an organic thin film thermocouple, or any other suitable material. The thermocouple 162 may be overlaid on a portion of the dielectric 160 above the thin film heater 155.

The thermocouple wiring 164 may be made of any suitable metallic interconnects, and may be formed using various known deposition and patterning techniques including the methods described above with respect to the metal lines 135. Deposition of the thermocouple wiring 164 may be performed using any suitable method in the art such as, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). Following the deposition, the thickness of the thermocouple wiring 164 may range from about 50 nm to about 100 nm, but thinner or thicker layers may be used as well. The thermocouple wiring 164 may be patterned using lithographic techniques following by removal of unwanted material through etching.

The through via 166 may be made of any suitable metallic interconnects, and may be formed using various known deposition and patterning techniques including the methods described above with respect to the through via 137. In the present embodiment, the through via 137 extends through the dielectric 160 and forms an electrical connection between the circuit region 120 by means of the metal lines 135 and the thermocouple 162 by means of the thermocouple wiring 164.

Figure 7:
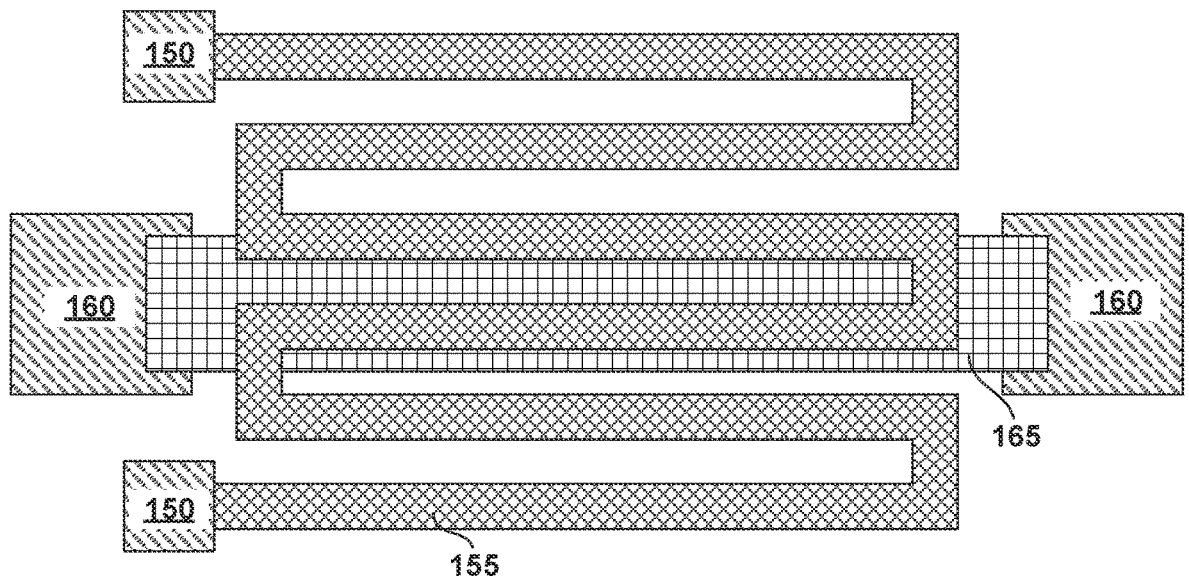
FIG. 7 is a top view depicting a first heater layout with a first thermocouple overlay, according to an example embodiment.
Figure 8:
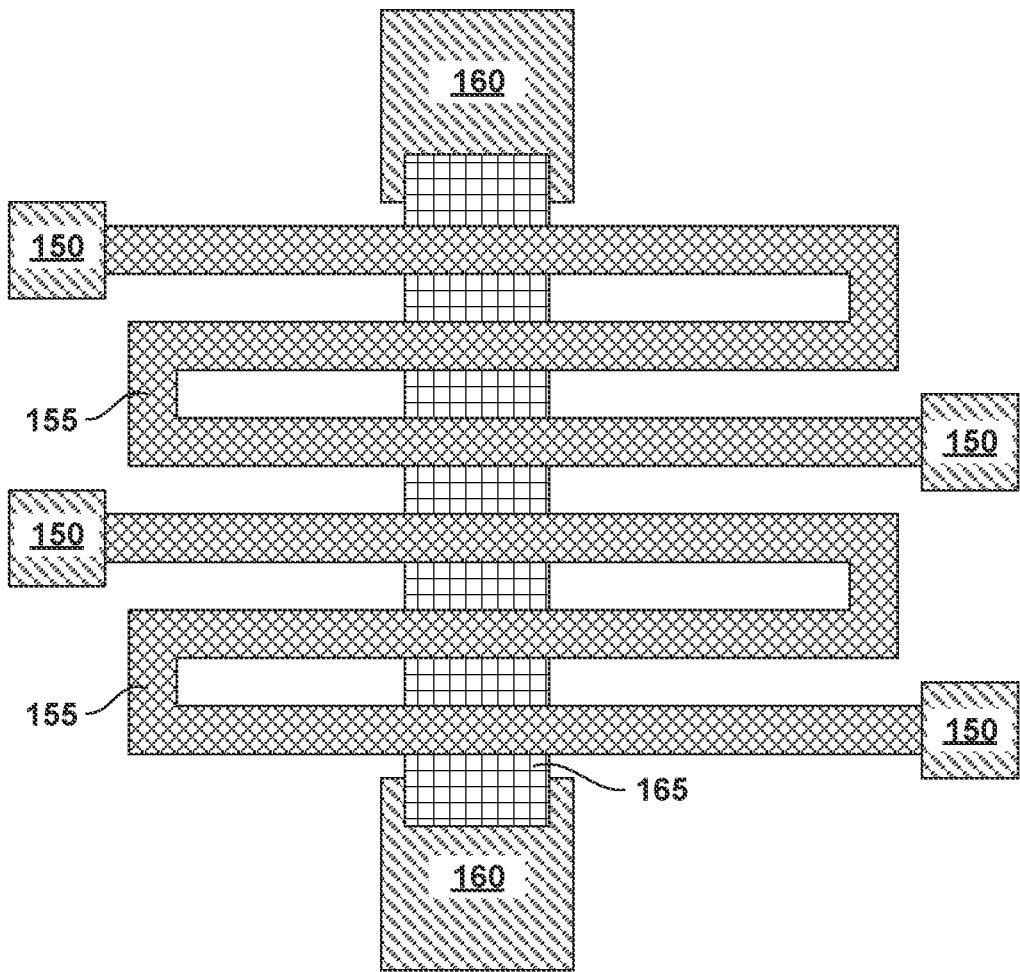
FIG. 8 is a top view depicting a second heater layout with a second thermocouple overlay, according to an example embodiment.

Additionally, the thermocouple 162 may overlay the thin film heater 155 in any given orientation or configuration. For example, FIG. 7 depicts a first layout of the thermocouple 162 overlaying the thin film heater 155 is depicted, where a single thermocouple (162) overlays a single element of the thin film heater 155. FIG. 8 depicts a second layout of the thermocouple 162 overlaying the thin film heater 155 is depicted, where a single thermocouple (162) overlays multiple elements of the thin film heater 155.

Figure 9:
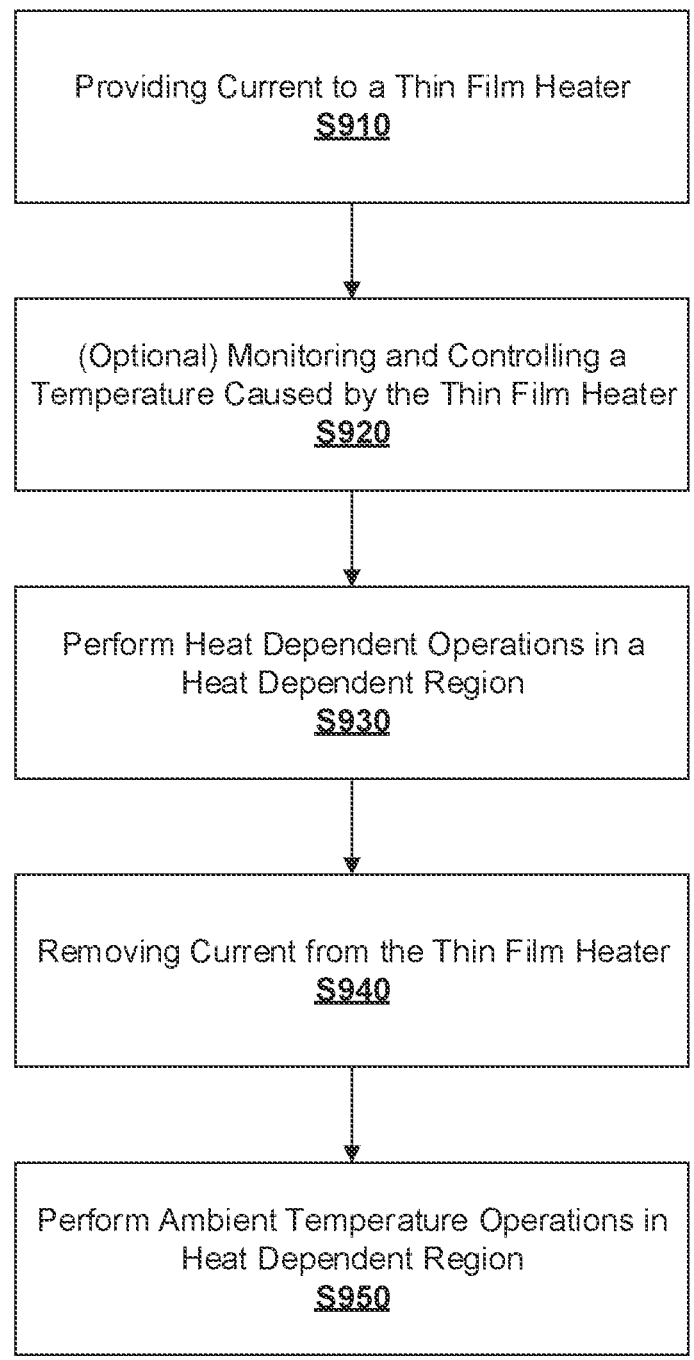
FIG. 9 is a method of operation of the fabricated device, according to an example embodiment.

FIG. 9 depicts an example method flow for operating a device with the thin film heater 155. According to step S910, current is allowed to flow to the thin film heater 155 by applying a voltage or current bias, thereby raising the temperature of the temperature-controlled region 125. According to step S920, if an optional thermocouple 162 is present, the current is monitored and controlled to maintain a set temperature by logic within the peripheral circuit region 120. The temperature sensed by the optional thermocouple 162 is a function of the actual temperature provided to the temperature-assisted programmable devices in the temperature-controlled region 125. The relationship between the sensed temperature and the actual temperature depends on the thermal properties, thicknesses and geometries of various layers and structures that function as thermal barriers (e.g. the BOX layer 110 and the dielectric 160) or thermal sinks (e.g. the lines 135 and the wirings 164). The relationship can be determined by thermal modeling (e.g. before fabrication) and/or by temperature calibration after fabrication. In some embodiments, at step S920, a signal may be sent confirming the set temperature has been achieved, thereby enabling operation of the temperature-controlled region 125. According to step 930, operations of the temperature-controlled region 125 are performed. In the embodiment of the flash memory detailed in U.S. patent application Ser. No. 16/785,797, the stored values of the flash memory may be programmed by the peripheral circuit region 120 during this step. This corresponds to the training operation in deep learning or neuromorphic computing. At this step, the peripheral circuit region 120 is at a sufficiently low temperature (e.g. below a maximum rated ambient temperature) to operate normally. In some embodiments, the peripheral circuit region 120 is at about or slightly higher than the ambient temperature at this step. According to step 940, voltage or current bias is removed from the thin film heater 155, and the device is allowed to cool to ambient temperature. According to step 950, the peripheral circuit region 120 may perform routine operations (or ambient temperature operations), such as accessing the stored flash memory, in the temperature-controlled region 125. This corresponds to the inference operation in deep learning or neuromorphic computing. Further, while described at a high level, layout of segments of the temperature-controlled region 125 and corresponding segments of the thin film heater 155 may allow the above methodology to be performed for a portion of the temperature-controlled region 125 at a time.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A semiconductor structure comprising:
   a heating element located beneath a temperature-controlled region of a chip; and
   a thermocouple, wherein the heating element is located between the temperature-controlled region and the thermocouple.

2. The semiconductor structure of claim 1, further comprising:
   an insulating layer located between the heating element and the temperature-controlled region.

3. The semiconductor structure of claim 1, further comprising:
   an insulating layer separating the heating element from the temperature-controlled region;
   a dielectric layer separating the heating element from the thermocouple.

4. The semiconductor structure of claim 1, further comprising:
   a circuit region, wherein the circuit region and the temperature-controlled region are both located on the same surface of an insulating layer.

5. The semiconductor structure of claim 4, further comprising:
   a via extending through the insulating layer, wherein a first end of the via is electrically connected to the circuit region, and wherein a second end of the via is electrically connected to the heating element.

6. The semiconductor structure of claim 3, further comprising:
   a via extending through the insulating layer and the dielectric layer, wherein a first end of the via is electrically connected to a circuit region, and wherein a second end of the via is electrically connected to the thermocouple.

7. The semiconductor structure of claim 1, wherein the temperature-controlled region comprises a flash memory.

8. A semiconductor structure comprising:
   an insulating layer separating a heating element from a temperature-controlled region of a chip;
   a circuit region located on a same surface of the insulating layer as the temperature-controlled region; and
   a thermocouple, wherein the heating element is located between the temperature-controlled region and the thermocouple.

9. The semiconductor structure of claim 8, further comprising:
   a via extending through the insulating layer, wherein a first end of the via is electrically connected to the circuit region, and wherein a second end of the via is electrically connected to the heating element.

10. The semiconductor structure of claim 8, further comprising:
    a via extending through the insulating layer and a dielectric layer, wherein a first end of the via is electrically connected to the circuit region, and wherein a second end of the via is electrically connected to the thermocouple.

11. The semiconductor structure of claim 8, wherein the temperature-controlled region comprises a flash memory.

12. A method of operating a semiconductor device comprising:
    providing current to a thin film heater located beneath a temperature-controlled region of the semiconductor device;
    performing temperature dependent operations in the temperature-controlled region of the semiconductor device; and
    wherein the temperature dependent operations include a training operation.

13. The method of claim 12, further comprising:
    monitoring and controlling a temperature caused by the thin film heater.

14. The method of claim 13, further comprising:
    enabling performance of the temperature dependent operations based on the temperature caused by the thin film heater.

15. The method of claim 12, further comprising:
    removing current flow to the thin film heater; and
    performing ambient temperature operations in the temperature-controlled region.

16. The method of claim 12, wherein the temperature-controlled region comprises a flash memory.

* * * * *